(12) United States Patent
Iwamatsu

(10) Patent No.: US 8,048,759 B2
(45) Date of Patent: Nov. 1, 2011

(54) SEMICONDUCTOR DEVICE AND METHOD OF MANUFACTURING THE SAME

(75) Inventor: Toshiaki Iwamatsu, Tokyo (JP)

(73) Assignee: Renesas Electronics Corporation, Kawasaki-Shi (JP)

( * ) Notice: Subject to any disclaimer, the term of this patent is extended or adjusted under 35 U.S.C. 154(b) by 58 days.

(21) Appl. No.: 12/720,287

(22) Filed: Mar. 9, 2010

(65) Prior Publication Data

US 2010/0167492 A1 Jul. 1, 2010

Related U.S. Application Data

(62) Division of application No. 11/870,610, filed on Oct. 11, 2007, now Pat. No. 7,692,243.

(30) Foreign Application Priority Data

Oct. 20, 2006 (JP) ................................ 2006-285688

(51) Int. Cl.
*H01L 21/762* (2006.01)
(52) U.S. Cl. ........ 438/404; 438/405; 438/149; 257/347; 257/348

(58) Field of Classification Search .................. 438/149, 438/404, 405; 257/347, 348, 349
See application file for complete search history.

(56) References Cited

U.S. PATENT DOCUMENTS

| 6,573,563 | B2 | 6/2003 | Lee et al. |
| 6,911,383 | B2 | 6/2005 | Doris et al. |
| 7,173,319 | B2 | 2/2007 | Iwamatsu et al. |
| 2002/0123205 | A1* | 9/2002 | Iwamatsu et al. ............. 438/404 |

FOREIGN PATENT DOCUMENTS

JP 2005-19996 1/2005

* cited by examiner

*Primary Examiner* — Thinh T Nguyen
(74) *Attorney, Agent, or Firm* — Oblon, Spivak, McClelland, Maier & Neustadt, L.L.P.

(57) ABSTRACT

The present invention aims at offering the semiconductor device which has the structure which are a high speed and a low power, and can be integrated highly. The present invention is a semiconductor device formed in the SOI substrate by which the BOX layer and the SOI layer were laminated on the silicon substrate. And the present invention is provided with the FIN type transistor with which the gate electrode coiled around the body region formed in the SOI layer, and the planar type transistor which was separated using partial isolation and full isolation together to element isolation, and was formed in the SOI layer.

6 Claims, 16 Drawing Sheets

F I G . 1 2
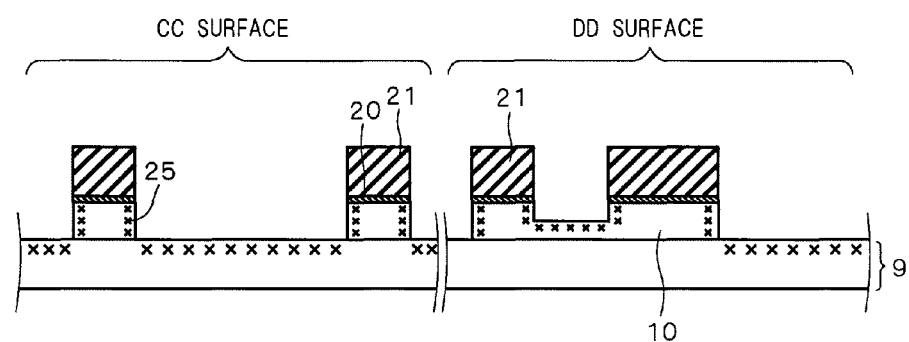
F I G . 1 3
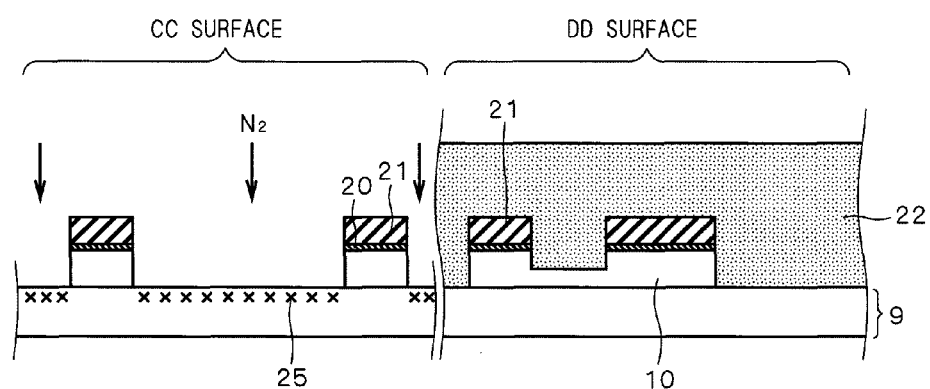

F I G . 1 8
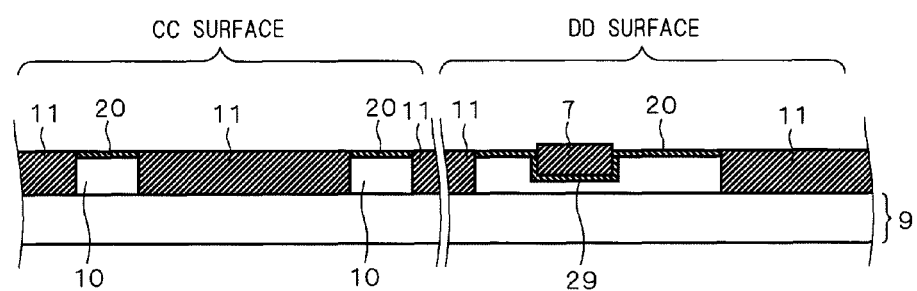
F I G . 1 9
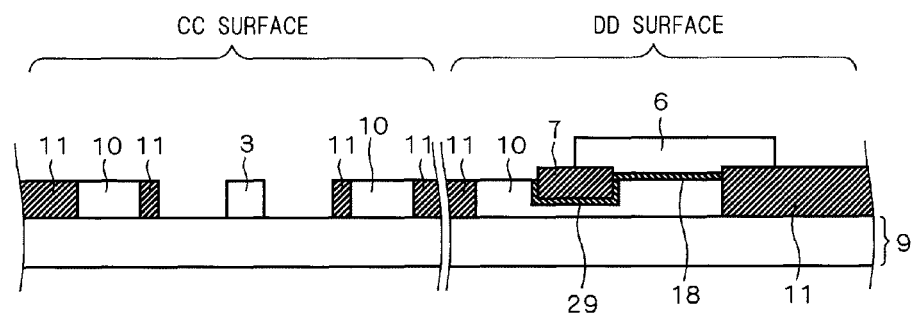

F I G . 2 0 A
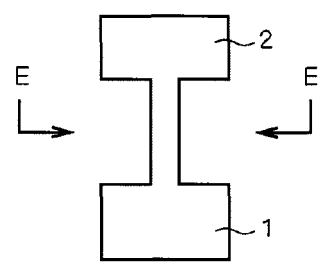
F I G . 2 0 B
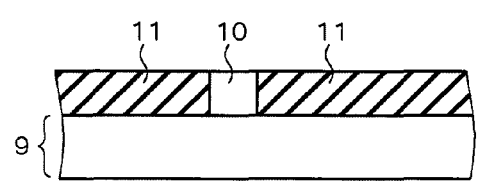
F I G . 2 1 A
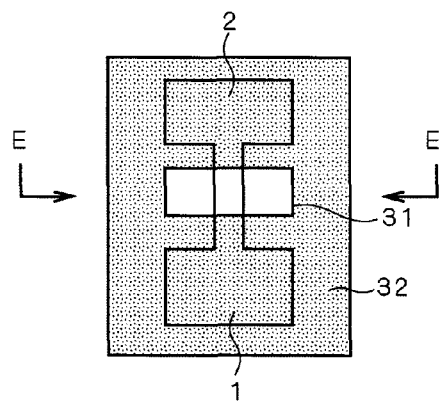
F I G . 2 1 B
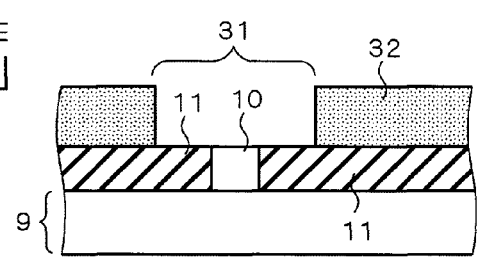

SEMICONDUCTOR DEVICE AND METHOD OF MANUFACTURING THE SAME

CROSS-REFERENCE TO RELATED APPLICATION

This application is a divisional and claims the benefit of priority under 35 U.S.C. §120 from U.S. application Ser. No. 11/870,610, filed Oct. 11, 2007 and claims the benefit of priority under 35 U.S.C, §119 of Japanese patent Application No. 2006-285688 filed on Oct. 20, 2006, the content of each of which is hereby incorporated by reference into this application.

FIELD OF THE INVENTION

The present invention is an invention concerning a semiconductor device and its manufacturing method, and relates to the semiconductor device using an SOI substrate, and its manufacturing method especially.

DESCRIPTION OF THE BACKGROUND ART

In recent years, the microfabrication of an element or a transistor is progressing with high integration of LSI (Large Scale Integration). However, it is faced with the physical limit of an element or a transistor in conventional ultra-fine processing technology. Therefore, new transistor structure except for a conventional planar type transistor is developed. The FIN type transistor which is a transistor of three dimensional structure is in the developed new transistor structure. The FIN type transistor is described, for example to Patent Reference 1.

On the other hand, in the SOI (Silicon on Insulator) device, on a Si substrate, an insulator and single-crystal Si (SOI layer) are laminated, and the transistor is formed on an SOI layer. In this SOI device, when it has the hybrid trench isolation which used partial isolation and full isolation together in element isolation, the high speed and low power operation of the SOI device concerned are attained. Since the substrate potential floating effect can be inhibited according to substrate potential fixation structure in an SOI device, application is also possible to an analog circuit, a digital circuit, etc.

[Patent Reference 1] Japanese patent laid-open No. 2005-019996

SUMMARY OF THE INVENTION

The controllability of the channel region by a gate electrode can be increased, and the FIN type transistor can inhibit a short channel effect effectively, and is effective in high integration. However, the FIN type transistor cannot realize the characteristics of a high breakdown voltage easily from the structure, and the application to an analog circuit or a digital circuit is difficult.

Then, the present invention aims at offering the semiconductor device which has the structure which are a high speed and low power, and can be integrated highly.

The solving means concerning the present invention is a semiconductor device formed in an SOI substrate in which an insulating layer and a silicon layer are laminated over a silicon substrate, and comprises a FIN type first active element in which a first control electrode coils around a body region formed in the silicon layer, and a planar type second active element which is separated using partial isolation and full isolation together to element isolation, and is formed in the silicon layer.

Since a semiconductor device described in the present invention is a semiconductor device formed in an SOI, and comprises a FIN type first active element in which a first control electrode coils around a body region, and a planar type second active element which is separated using partial isolation and full isolation together to element isolation, and is formed in the silicon layer, the semiconductor device of high speed and low power and high integration is realizable.

BRIEF DESCRIPTION OF THE DRAWINGS

FIGS. 12 and 13 are cross-sectional views for explaining the manufacturing method of the semiconductor device concerning Embodiment 2 of the present invention;

FIGS. 14 to 19 are cross-sectional views for explaining the manufacturing method of the semiconductor device concerning Embodiment 3 of the present invention;

FIGS. 20A to 23C are plan views and cross-sectional views for explaining the manufacturing method of the semiconductor device concerning Embodiment 4 of the present invention;

DETAILED DESCRIPTION OF THE PREFERRED EMBODIMENTS

Embodiment 1

Figure 1:
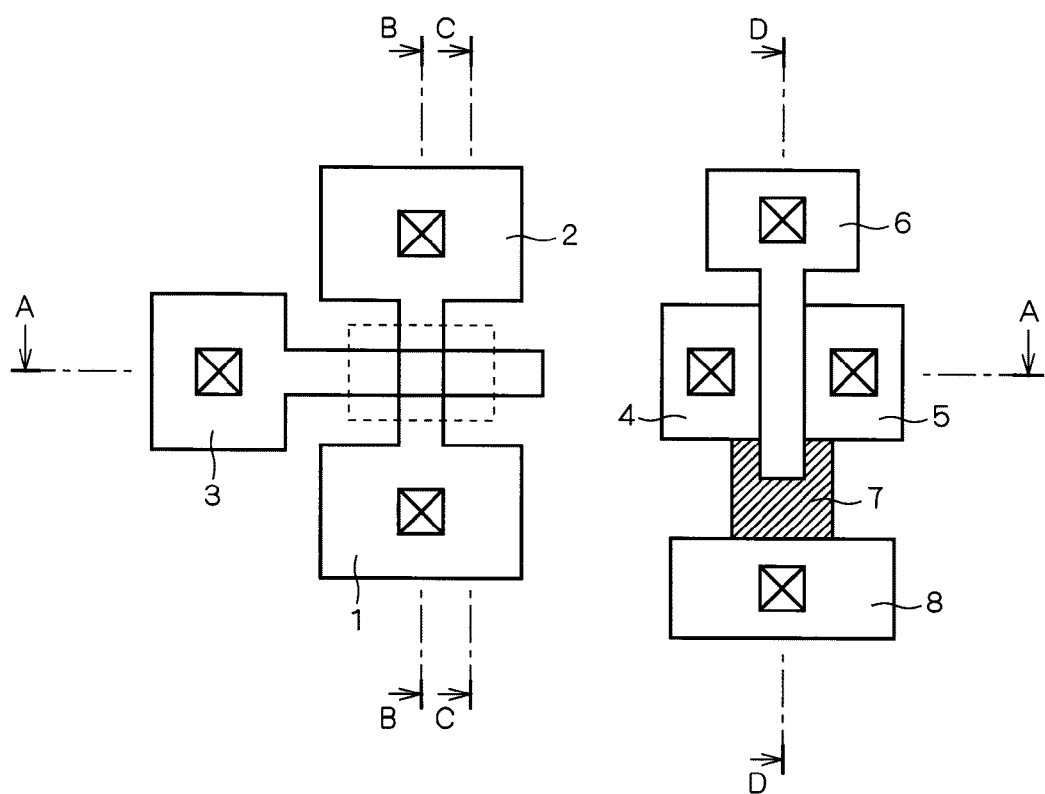
FIG. 1 is a plan view of the semiconductor device concerning Embodiment 1 of the present invention.

The plan view of the semiconductor device concerning this embodiment is shown in FIG. 1. The semiconductor device shown in FIG. 1 is the structure where the planar type SOI transistor and the FIN type transistor were loaded together. In FIG. 1, left-hand side is a FIN type transistor, and right-hand side is a planar type SOI transistor. The FIN type transistor of FIG. 1 is the structure with which gate electrode 3 was formed so that it might extend between source electrode 1 and drain electrode 2, and the gate electrode 3 concerned coiled around the body region (not shown with a plan view) formed in the SOI layer. On the other hand, gate electrode 6 is formed between source electrode 4 and drain electrode 5, and, as for the planar type SOI transistor, partial isolation film 7 and body region 8 are formed in the point of gate electrode 6. The planar type SOI transistor has adopted as the element isolation of an SOI film the hybrid trench isolation structure which uses partial isolation and full isolation together.

Figure 2:
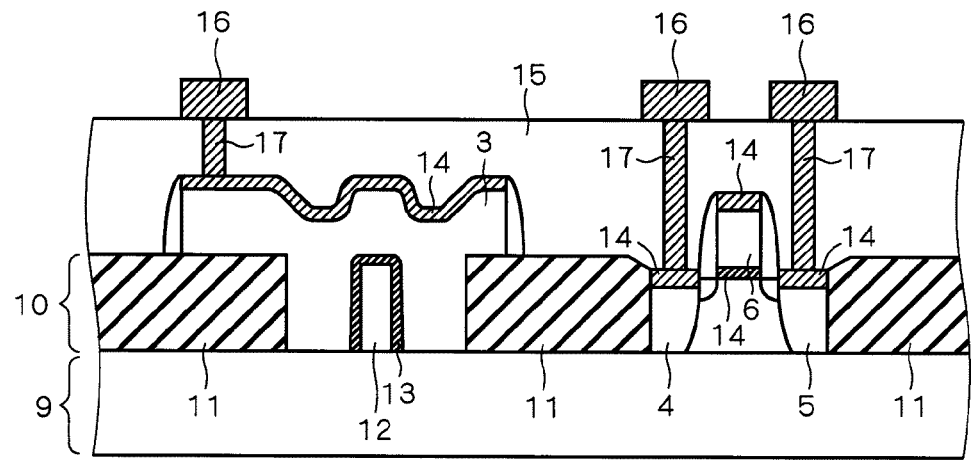
FIG. 2 is a cross-sectional view of the semiconductor device concerning Embodiment 1 of the present invention.

The cross-sectional view in AA surface of the FIN type transistor and planar type SOI transistor which were shown by FIG. 1 is shown in FIG. 2. In FIG. 2, the FIN type transistor and the planar type SOI transistor are formed in SOI layer 10 on BOX (Buried Oxide) layer 9 which is an insulating layer. And the FIN type transistor and planar type SOI transistor which are shown in FIG. 2 are separated by STI (shallow trench isolation) oxide film 11 which is a full isolation film, respectively. In the circumference of body region 12 of a FIN type transistor, STI oxide film 11 is removed, and gate electrode 3 is formed so that it may coil around body region 12. Gate insulating film 13 is formed between gate electrode 3 and body region 12.

Figure 3:
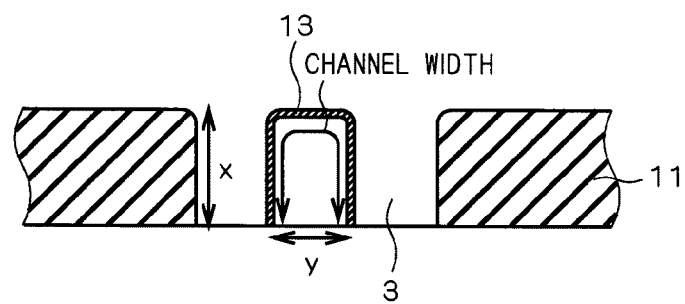
FIG. 3 is a cross-sectional view of the body region of the semiconductor device concerning Embodiment 1 of the present invention.

In FIG. 2, the upper layer of gate electrode 3 is done silicidation 14. And on gate electrode 3 done silicidation 14, interlayer insulation film 15 and the upper wiring 16 are formed, and the upper wiring 16 and gate electrode 3 are electrically connected by via hole 17. With the FIN type transistor shown in FIG. 2, since it is the structure with which gate electrode 3 coiled around body region 12, effectual channel width becomes wide and current drive capability improves. The enlarged view around body region 12 is shown in FIG. 3. As shown in FIG. 3, channel width constitutes 2x+y which added width y of body region 12 to the twice of thickness (=thickness of body region 12) x of an SOI layer.

On the other hand, as for the planar type SOI transistor shown in FIG. 2, gate electrode 6 is formed on gate insulating film 18 between source electrode 4 and drain electrode 5. Each upper layer of source electrode 4, drain electrode 5, and gate electrode 6 is also done silicidation 14. On source electrode 4, drain electrode 5, and gate electrode 6, interlayer insulation film 15 and the upper wiring 16 are formed, and the upper wiring 16, and drain electrode 5 and gate electrode 6 are electrically connected by via hole 17.

Figure 4A:
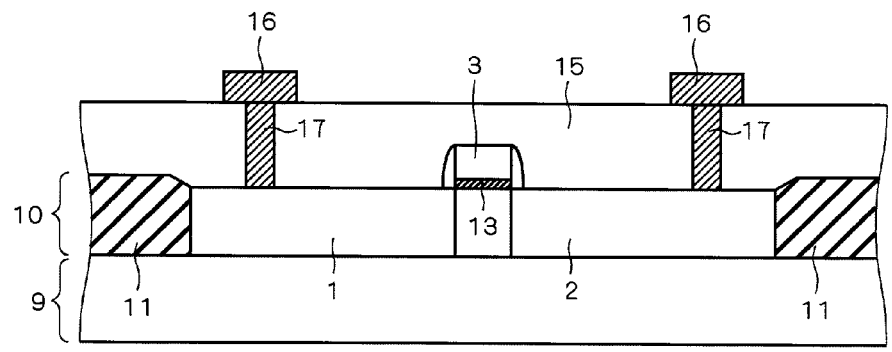
FIGS. 4A to 5 are cross-sectional views of the semiconductor device concerning Embodiment 1 of the present invention.
Figure 4B:
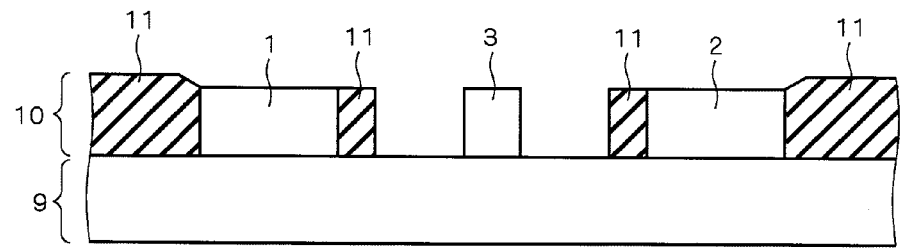

The cross-sectional view in BB surface of the FIN type transistor shown in FIG. 1 is shown in FIG. 4A, and the cross-sectional view in CC surface of the FIN type transistor shown in FIG. 1 is shown in FIG. 4B. BB section of FIG. 4A shows the section of the central part of the FIN type transistor, and the section concerned is the structure as practically equal as a conventional planar type transistor. That is, source electrode 1 and drain electrode 2 are formed in SOI layer 10 separated with STI oxide film 11, and gate electrode 3 is formed via gate insulating film 13 between source electrode 1 and drain electrode 2. And as FIG. 4A shows, source electrode 1 and drain electrode 2 are electrically connected with the upper wiring 16 formed on interlayer insulation film 15 through via hole 17.

On the other hand, in the section of CC surface shown in FIG. 4B, it has the structure where STI oxide film 11 once formed in the SOI layer between source electrode 1 and drain electrode 2 was removed leaving a part, and gate electrode 3 was formed after that.

Figure 5:
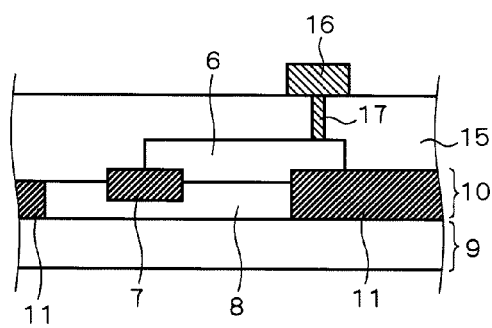

The section of DD surface of the planar type SOI transistor shown in FIG. 1 is shown in FIG. 5. In FIG. 5, body region 8 is formed in SOI layer 10 separated with STI oxide film 11, and partial isolation film 7 is formed in a part of body region 8 concerned. In FIG. 5, gate electrode 6 is formed between partial isolation film 7, and one STI oxide film 11, and the gate electrode 6 concerned is electrically connected with the upper wiring 16 formed on interlayer insulation film 15 through via hole 17.

Figure 6:
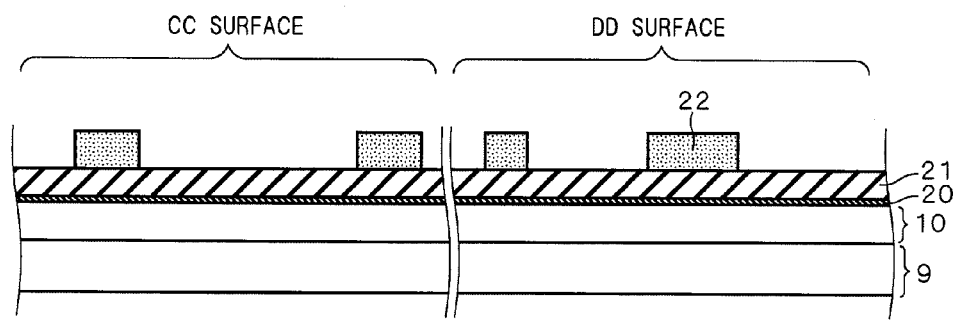
FIGS. 6 to 11 are cross-sectional views for explaining the manufacturing method of the semiconductor device concerning Embodiment 1 of the present invention.

Next, paying attention to the section of CC surface and DD surface which are shown in FIG. 1, a manufacturing process is explained below. First, the process-flow picture of a FIN type transistor and a planar type SOI transistor is shown in FIG. 6-FIG. 11. To the SOI substrate which is shown in FIG. 6, and which has BOX layer 9 which is an insulating layer, pad oxide film 20 and nitride film 21 which constitute a mask in the case of the separation film formation are formed on SOI layer 10 one by one. Then, resist 22 is used as a mask and dry etching removes nitride film 21, pad oxide film 20, and a part of SOI layer 10. At this time, nitride film 21, pad oxide film 20, and SOI layer 10 may be etched at once using the mask of resist 22. Nitride film 21 is etched using the mask of resist 22, after removal of resist 22, nitride film 21 may be used as a mask and pad oxide film 20 and SOI layer 10 may be etched.

Figure 7:
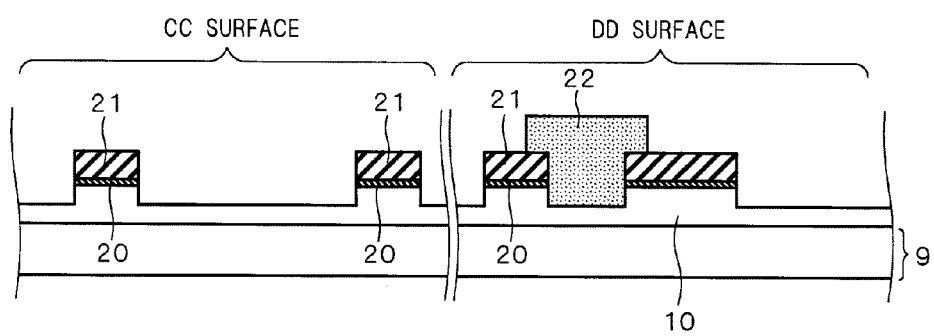
Figure 8:
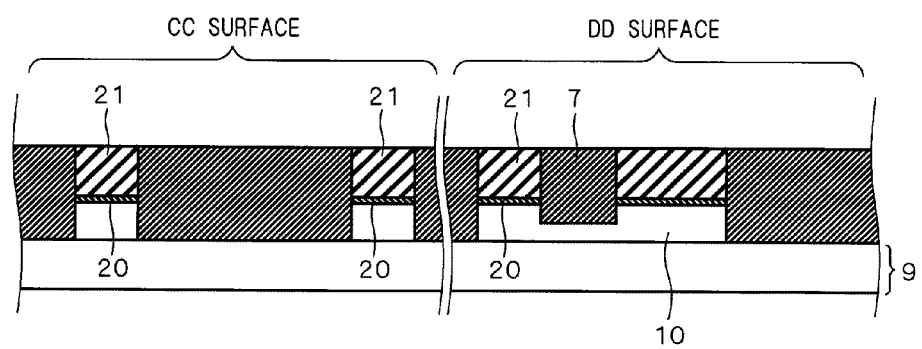

Next, in FIG. 7, resist 22 is formed between the remaining nitride films 21 of DD surface, the resist 22 concerned is used as a mask, and SOI layer 10 is etched. In the region without resist 22, SOI layer 10 is altogether etched by this etching. Then, as shown in FIG. 8, STI oxide film 11 of a full isolation film is formed. As this STI oxide film 11, a high-density CVD (Chemical Vapor Deposition) oxide film, a HDP (High Density Plasma) oxide film, the SOD (Spin On Dielectric) oxide film applied and formed, or the oxide film of such mixed-loading structures may be adopted.

According to the process shown in FIG. 7 and FIG. 8, STI oxide film 11 of full isolation and partial isolation film 7 of partial isolation can be formed simultaneously. Planarizing of the structure of FIG. 8 is further done in a front surface by a CMP (Chemical Mechanical Polishing) process etc., and nitride film 21 is removed.

Figure 9:
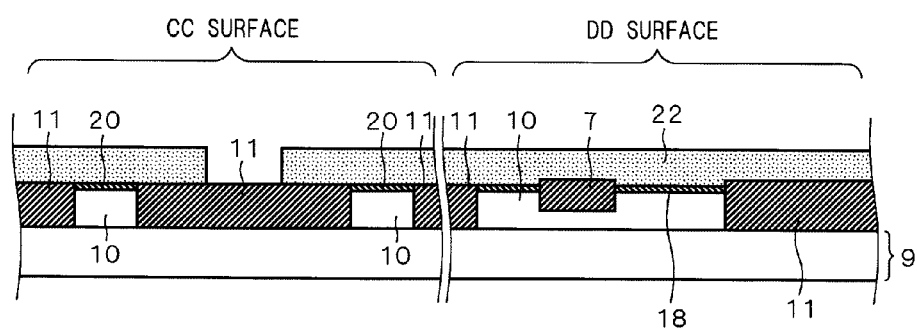

Next, in FIG. 9, in order to remove a part of STI oxide films 11 of CC surface, resist 22 is formed. In order to use resist 22 as a mask and to etch STI oxide film 11, wet treatment using HF (hydrogen fluoride) and dry etching processing using a plasma process are performed. Then, although not illustrated, the impurity for threshold value voltage adjustment is implanted, and pad oxide film 20 on SOI layer 10 is removed. Gate insulating films 13 and 18 are formed on SOI layer 10, and polysilicon used as gate electrodes 3 and 6 is deposited.

Figure 10:
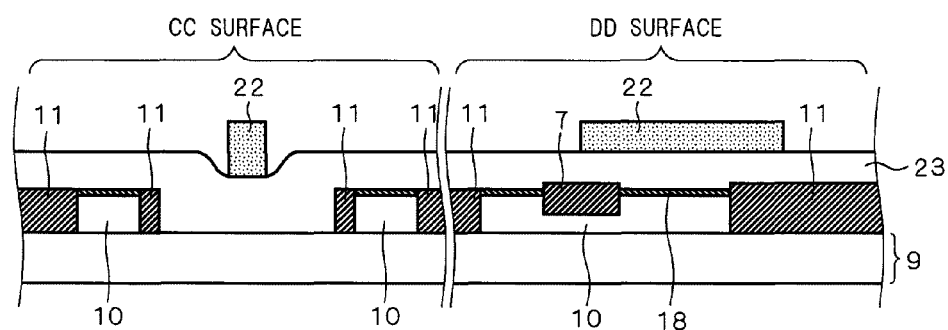
Figure 11:
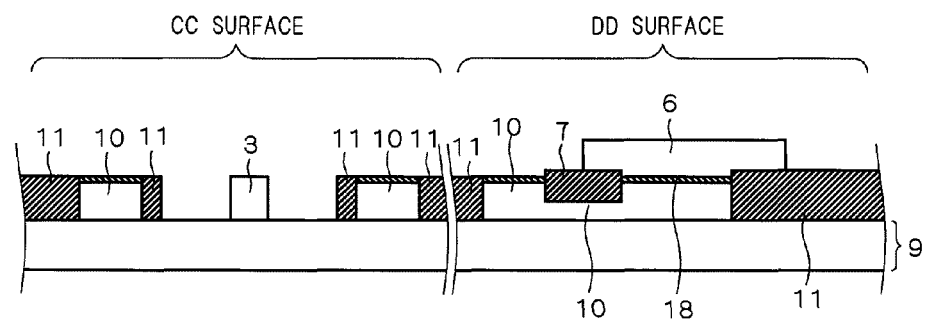

Next, in FIG. 10, in order to form gate electrodes 3 and 6 from deposited polysilicon 23, resist 22 of a predetermined pattern is formed. This resist 22 is used as a mask, polysilicon 23 is etched, an unnecessary portion is removed, and gate electrodes 3 and 6 as shown in FIG. 11 are formed.

Future processes are the same as forming a transistor in the usual CMOS process, for example, the same as the process after formation of a gate electrode described to Japanese patent laid-open No. 2000-243973.

As mentioned above, since this embodiment is provided with the element isolation forming step which forms STI oxide film 11 of full isolation which reaches in BOX layer 9, and partial isolation film 7 which does not reach in BOX layer 9 in the predetermined position of SOI layer 10, the removal process which removes STI oxide film 11 of the predetermined position which forms a FIN type transistor, and the control electrode forming step which forms gate electrode 3 in the position which removed STI oxide film 11 at the removal process, and simultaneously forms gate electrode 6 of a planar type SOI transistor, the semiconductor device consolidated with the FIN type transistor and planar type SOI transistor which are a high speed and low power, and can be integrated highly can be manufactured.

Embodiment 2

By this embodiment, before depositing the STI oxide film which is a separation film, the process which does nitriding treatment is explained. The drawing for explaining the process of the nitriding treatment concerning this embodiment is shown in FIG. 12 and FIG. 13. FIG. 12 is the drawing after etching SOI layer 10 to the FIG. 7 explained by Embodiment 1, and is the drawing before forming STI oxide film 11 of FIG. 8. And at FIG. 12, nitriding treatment is performed by heating a substrate for several seconds-several minutes at the temperature of 900° C.~1200° C. in a nitrogen atmosphere.

By this nitriding treatment, the front surface of BOX layer 9 and the side surface of SOI layer 10 constitute nitrided region 25. When removing STI oxide film 11 in part, this nitrided region 25 functions as an etching stopper and can prevent that BOX layer 9 is etched superfluously.

The nitriding treatment shown in FIG. 13 exists except for the nitriding treatment shown in FIG. 12. The nitriding treatment shown in FIG. 13 is processing which implants high-concentration nitrogen etc. only into the surface area of BOX layer 9. Even if it is this nitriding treatment, region 25 which was formed in the front surface of BOX layer 9 and which was nitrided with high concentration nitrogen constitutes an etching stopper. When region 25 which is shown in FIG. 13 and which was nitrided by nitriding treatment is formed, nitrogen will not be implanted into the region used as the channel of a FIN type transistor, and the reliability of a transistor will improve. In the nitriding treatment shown in FIG. 13, carbon may be used as an implanting element except for nitrogen.

Embodiment 3

Figure 14:
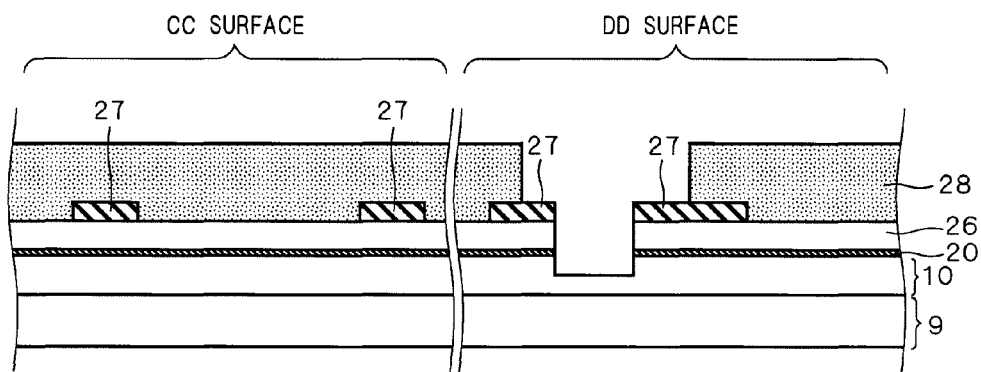

This embodiment shows how to form an individual liner oxide film to a partial isolation film. The process-flow picture concerning this embodiment is shown in FIG. 14-FIG. 19. In FIG. 14, pad oxide film 20, polysilicon 26, and nitride film 27 are deposited on SOI layer 10 on BOX layer 9, nitride film 27 is etched, and the mask for forming a separation film is formed. Then, resist 28 which makes an opening only in the region which forms a partial isolation film is formed on polysilicon 26 and nitride film 27, the resist 28 concerned is used as a mask, and a part of SOI layer 10 is etched.

Figure 15:
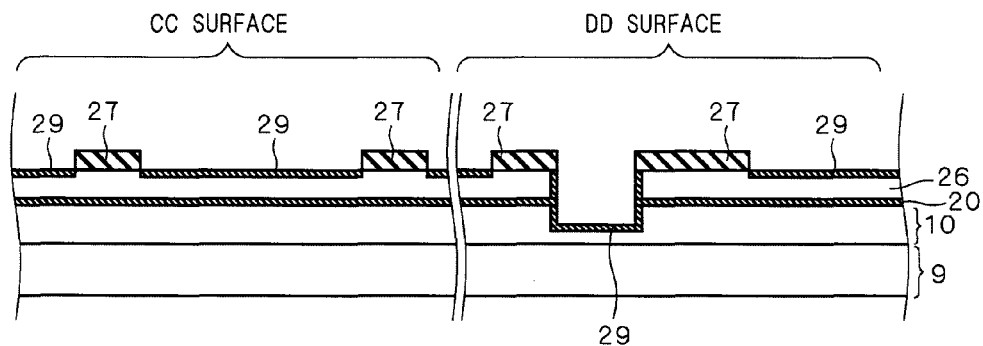

Next, as shown in FIG. 15, the front surface of polysilicon 26 and SOI layer 10 which were exposed is oxidized. Liner oxide film 29 can be formed in the front surface of polysilicon 26, and SOI layer 10 of the region which forms a partial isolation film by this oxidization.

Figure 16:
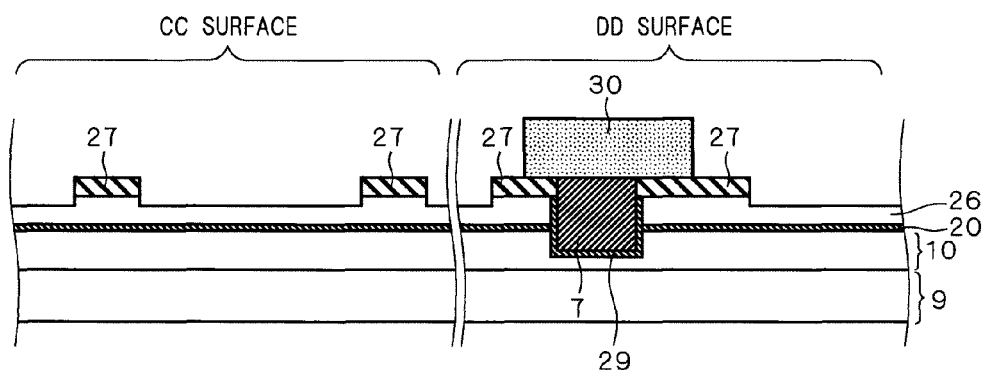

Then, as shown in FIG. 16, an oxide film is embedded and partial isolation film 7 is formed. At FIG. 16, after forming partial isolation film 7, it leaves resist 30 on partial isolation film 7, and liner oxide film 29 formed in the front surface of polysilicon 26 is removed by wet etching etc.

Figure 17:
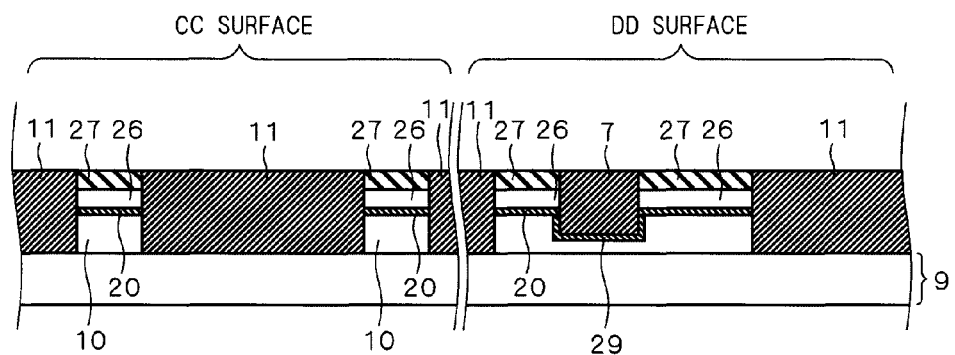

Next, in FIG. 16, polysilicon 26, pad oxide film 20, and SOI layer 10 except nitride film 27 and resist 30 having been formed are removed by dry etching. In the region except nitride film 27 and resist 30 having been formed, BOX layer 9 will be exposed with this dry etching. As shown in FIG. 17, the oxide film used as a separation oxide film is embedded into the portion where BOX layer 9 exposed, and STI oxide film 11 is formed.

Next, as shown in FIG. 18, CMP treatment is performed and polysilicon 26, nitride film 27, a part of STI oxide films 11, and a part of partial isolation films 7 are removed. Then, the impurity for threshold value voltage adjustment is implanted, pad oxide film 20 on SOI layer 10 is removed, and it becomes the structure of FIG. 19 by forming gate electrodes 3 and 6 and gate insulating film 18.

As mentioned above, in this embodiment, since STI oxide film 11 which is a full isolation film is formed after formation of partial isolation film 7 unlike Embodiment 1, liner oxide film 29 can be formed. In this embodiment, by forming liner oxide film 29, the portion which constitutes a corner is reduced from SOI layer 10 form near the gate electrode 6, and concentration of an electric field can be reduced.

Embodiment 4

This embodiment shows the process which forms a gate spacer around the level difference which removed the STI oxide film selectively in the near part of the gate electrode of a FIN type transistor. The plan view of the source electrode 1 and drain electrode 2 circumference of the FIN type transistor after STI formation is shown in FIG. 20A. The cross-sectional view of EE surface of FIG. 20A is shown in FIG. 20B. In FIG. 20B, STI oxide film 11 is formed on BOX layer 9 at the both sides of SOI layer 10.

Next, as shown in FIG. 21A, resist 32 is formed except for region 31 used as the channel of a FIN type transistor. The cross-sectional view of EE surface of FIG. 21A is shown in FIG. 21B. By etching STI oxide film 11 by using this resist 32 as a mask, BOX layer 9 of region 31 used as a channel is exposed. That is, STI oxide film 11 of the circumference used as the body region of a FIN type transistor is removed, and step shape is formed.

Figure 22A:
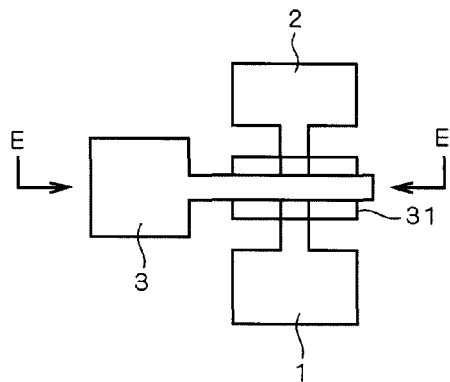
Figure 22B:
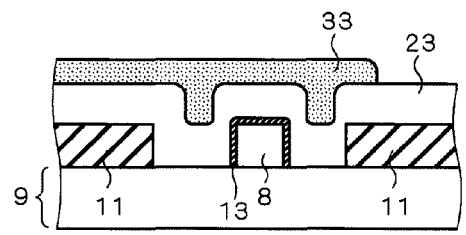

Then, as shown in FIG. 22A, gate electrode 3 is formed in the portion comprising region 31 used as a channel. The cross-sectional view of EE surface of FIG. 22A is shown in FIG. 22B. However, FIG. 22B is the cross-sectional view before patterning gate electrode 3, polysilicon 23 which is the material of gate electrode 3 accumulates on the whole surface, and resist 33 used as a mask is formed on it. In FIG. 22B, gate insulating film 13 is formed on body region 8.

Figure 23A:
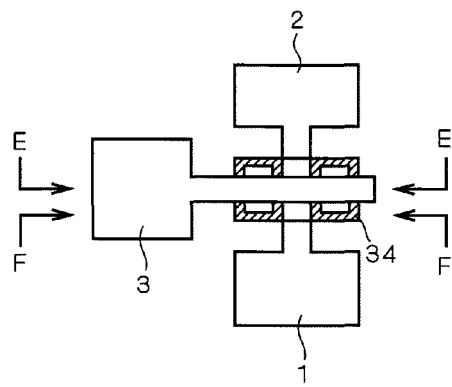
Figure 23B:
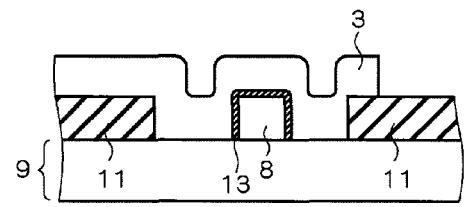
Figure 23C:
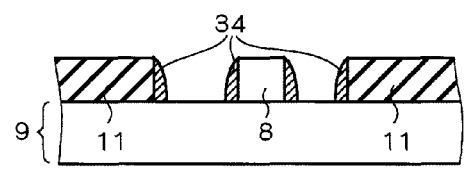

In this embodiment, as shown in FIG. 23A, gate electrode 3 is formed, simultaneously gate spacer 34 is formed on the STI oxide film 11 circumference in region 31 used as a channel, and the circumference of a body region. A state that gate electrode 3 is formed so that it may coil around body region 8 is shown by the FIG. 23B which is a cross-sectional view of EE surface of FIG. 23A. Gate insulating film 13 is formed between body region 8 and gate electrode 3. A state that gate spacer 34 which consists of polysilicon is formed on the STI oxide film 11 circumference in region 31 used as a channel and the circumference of body region 8 is shown by the FIG. 23C which is a cross-sectional view of FF surface of FIG. 23A.

Figure 24A:
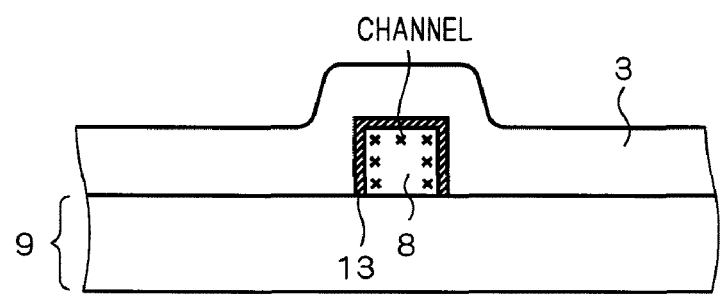
FIGS. 24A and 24B are cross-sectional views of the body region of the semiconductor device concerning Embodiment 4 of the present invention.

By removing STI oxide film 11 of the circumference used as the body region of a FIN type transistor, and forming gate spacer 34 in step shape, it becomes possible to reduce the parasitic resistance of a FIN type transistor, and a highly efficient transistor can be formed. In the FIG. 24A which is an enlarged view of the body region 8 circumference of FIG. 23B, since gate electrode 3 encloses the side surface and the upper surface of body region 8, a channel is formed in the portion concerned. On the other hand, in the FIG. 24B which is an enlarged view of the body region 8 circumference of FIG. 23C, since gate spacer 34 is formed in the side surface of body region 8, a channel is formed in the portion concerned.

Figure 24B:
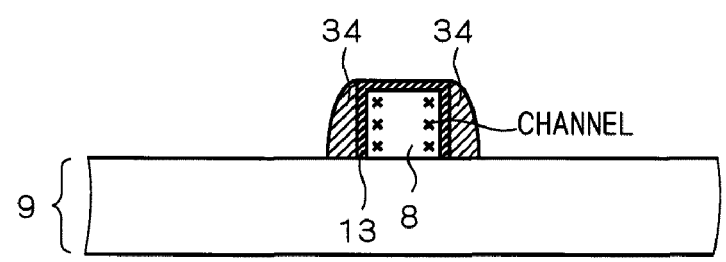

That is, in this embodiment, the FIN type transistor by which a channel is formed in body region 8 which touches gate electrode 3 and gate spacer 34 can be formed. When microfabrication progresses and thinning of body region 8 progresses, transistor characteristics will be decided by the channel formed in the side surface of body region 8. Therefore, the parasitic resistance reduction by gate spacer 34 shown in FIG. 24B is effective in an improvement of transistor characteristics.

Impurity implantation to source electrode 1 and drain electrode 2 has an impurity profile in which the concentration of SOI layer 10 front surface is high, and which becomes low as it becomes deep. The impurity profile concerned has the same tendency also in body region 8. And by forming in body region 8 gate spacer 34 shown in FIG. 24B, when gate voltage is applied to body region 8 near the interface of BOX layer 9, a channel is formed and the parasitic resistance of body region 8 can be reduced.

Embodiment 5

Figure 25A:
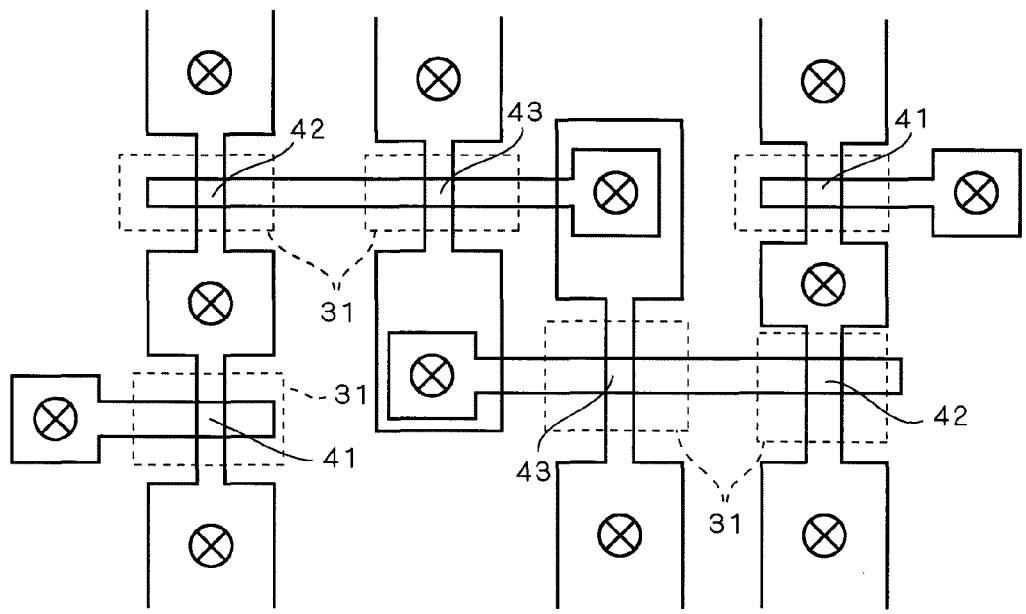
FIGS. 25A and 25B are plan views of the semiconductor device concerning Embodiment 5 of the present invention.
Figure 25B:
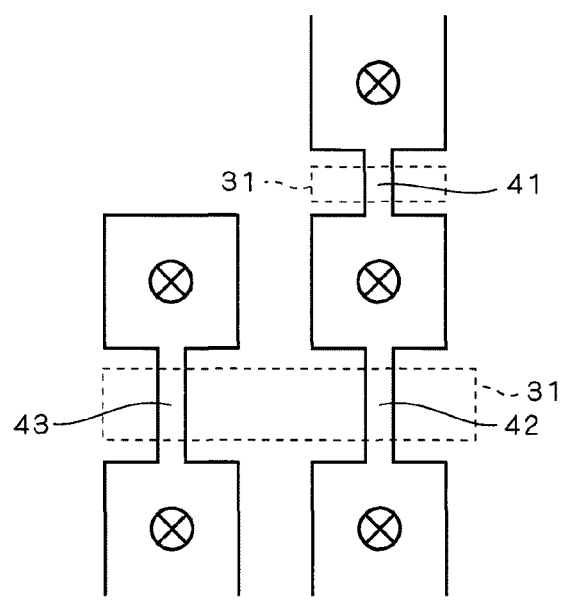

The plan view of the SRAM memory cell concerning this embodiment is shown in FIGS. 25A and 25B. At FIG. 25A, each of access transistor 41, driver transistor 42, and load transistor 43 which forms an SRAM memory cell is formed with the FIN type transistor described by Embodiment 4 etc. Although not illustrated, the planar type SOI transistor which has adopted hybrid trench isolation structure is used for transistors other than FIG. 25A which form an SRAM memory.

And in this embodiment, when forming gate spacer 34 shown by FIG. 23A, and applying the structure of reducing parasitic resistance in a FIN type transistor, region 31 used as a channel which removes an STI oxide film as shown in FIG. 25A is formed for each transistor. That is, in FIG. 25A, since it has two access transistors 41, driver transistors 42, and load transistors 43, respectively, a total of six independent regions (region 31 used as a channel) which remove an STI oxide film will be formed.

As mentioned above, in this embodiment, since the region of the STI oxide film removed (region 31 used as a channel) is independent for every FIN type transistor, the short circuit of a gate spacer is avoidable. In this embodiment, as shown in FIG. 25A, the region of the STI oxide film removed (region 31 used as a channel) was independently formed for every FIN type transistor. However, the present invention may not be restricted to this, but as shown in FIG. 25B, the structure which makes an opening of the region common to driver transistor 42 and load transistor 43 used as the same gate of the STI oxide film removed (region 31 used as a channel) is sufficient as it.

Embodiment 6

Figure 26:
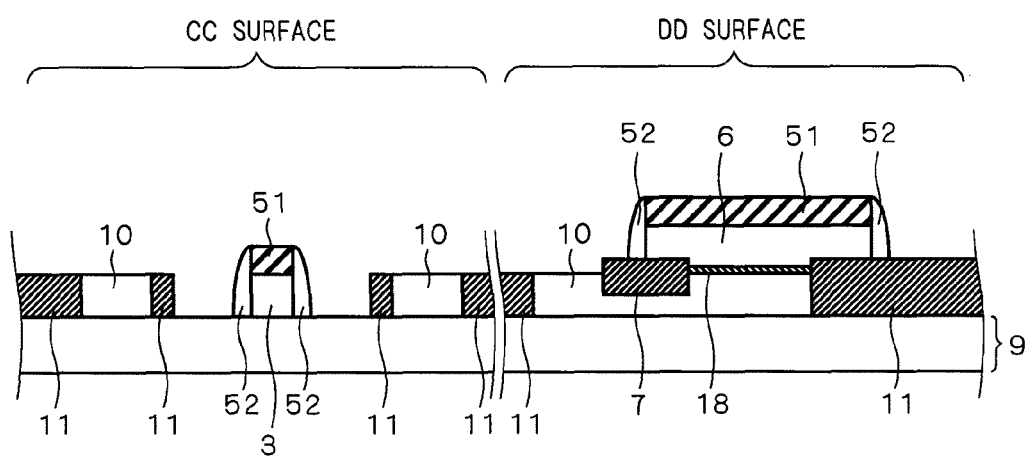
FIGS. 26 to 28 are cross-sectional views for explaining the manufacturing method of the semiconductor device concerning Embodiment 6 of the present invention.
Figure 27:
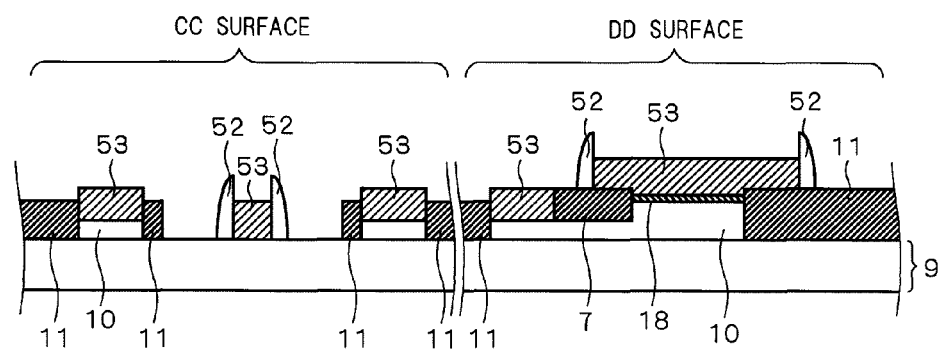
Figure 28:
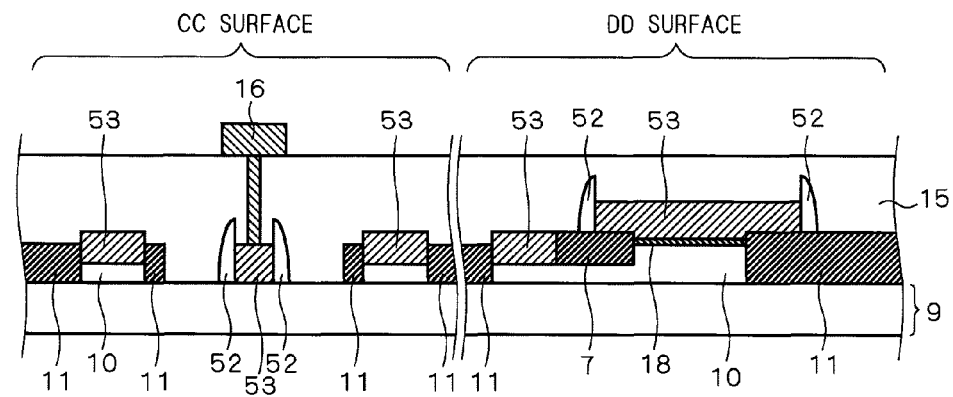

This embodiment shows the example which applied the FUSI (Fully Silicided Poly Gates) process which silicides gate polysilicon to the manufacturing method of the semiconductor device concerning Embodiment 4. The flow diagram of the manufacturing method of the semiconductor device concerning this embodiment is shown in FIG. 26-FIG. 28. First, with the structure shown in FIG. 19 of Embodiment 4, polysilicon was patterned by the monolayer and gate electrodes 3 and 6 were formed. However, with the structure shown in FIG. 26, on polysilicon, nitride film 51 is laminated, it patterns by dry etching, and gate electrodes 3 and 6 are formed.

With the structure shown in FIG. 26, spacer 52 is further formed with the oxide film or the nitride film to gate electrodes 3 and 6. Then, in this embodiment, nitride film 51 of gate electrodes 3 and 6 is removed. The mask of an insulating film is made into gate electrodes 3 and 6 by forming spacer 52 around gate electrodes 3 and 6. Then, impurity implantation is performed in SOI layer 10 which forms source electrodes 1 and 3 and drain electrodes 2 and 4. As shown in FIG. 27, SOI layer 10 which forms source electrodes 1 and 3 and drain electrodes 2 and 4, and the silicon layer of gate electrodes 3 and 6 are done silicidation 53. Ni etc. is used for silicide material, for example.

As mentioned above, since the work function difference of gate material can be adjusted by doing gate electrodes 3 and 6 silicidation 53 in this embodiment, adjustment of the threshold value voltage of a FIN type transistor becomes easy. As a mask material on the polysilicon used for gate electrodes 3 and 6, SiGe may be used except for nitride film 51 mentioned above.

In gate electrodes 3 and 6 shown in FIG. 27, thickness of polysilicon is made thinner than the thickness of SOI layer 10, and all the polysilicon is done silicidation 53. On the other hand, SOI layer 10 shown in FIG. 27 was not made all silicidation 53, but the silicon layer remains near the interface of BOX layer 9. Therefore, this embodiment can also reduce parasitic resistance by forming the gate spacer described by Embodiment 4 in the silicon layer which remained without taking silicidation 53 among the side walls of SOI layer 10.

In FIG. 28, interlayer insulation film 15 and the upper wiring 16 were formed after silicidations 53, of such as gate electrodes 3 and 6, and gate electrode 3 and the upper wiring 16 are electrically connected through via hole 17. In FIG. 28, in order to explain the upper wiring 16 and via hole 17, the upper wiring 16 and via hole 17 which originally are not on CC surface of FIG. 1 were notionally illustrated in the section of CC surface.

What is claimed is:

1. A method of manufacturing a semiconductor device to an SOI substrate in which an insulating layer and a silicon layer are laminated over a silicon substrate, comprising: a FIN type first active element in which a first control electrode coils around a body region formed in the silicon layer; and a planar type second active element which is separated using partial isolation and full isolation together to element isolation, and is formed in the silicon layer; and comprising the steps of:
    doing element isolation formation which forms in a predetermined position of the silicon layer a full isolation film which reaches in the insulating layer, and a partial isolation film which does not reach in the insulating layer;
    removing the full isolation film in a predetermined position where the first active element is formed; and
    doing control electrode formation which forms a second control electrode of the second active element at the same time of forming the first control electrode in a position where the full isolation film is removed in the removing step.

2. A method of manufacturing a semiconductor device according to claim 1, wherein
    in the step of doing the element isolation formation, nitriding treatment is performed, before forming the full isolation film and the partial isolation film.

3. A method of manufacturing a semiconductor device according to claim 1, wherein
    in the step of doing the element isolation formation, nitrogen implantation is performed to the insulating layer which forms the full isolation film.

4. A method of manufacturing a semiconductor device according to claim 1, wherein
    in the step of doing the element isolation formation, after forming the partial isolation film, the full isolation film is formed.

5. A method of manufacturing a semiconductor device according to claim 1, wherein
    in the step of doing the control electrode formation, simultaneously with formation of the first control electrode, a spacer electrically connected with the first control electrode is formed at a side wall of the body region.

6. A method of manufacturing a semiconductor device according to claim 1, further comprising a step of:
    siliciding the first control electrode and the second control electrode, and the silicon layer of a predetermined region.

* * * * *